Sept. 22, 1964 W. B. WARREN 3,149,396

METHOD OF MAKING SEMICONDUCTOR ASSEMBLIES

Original Filed Dec. 22, 1959

WILLIAM B. WARREN,
INVENTOR

BY Charles A. Haughey
ATTORNEY.

United States Patent Office 3,149,396
Patented Sept. 22, 1964

3,149,396
METHOD OF MAKING SEMICONDUCTOR ASSEMBLIES

William B. Warren, Costa Mesa, Calif., assignor to Hughes Aircraft Company, Culver City, Calif., a corporation of California
Original application Dec. 22, 1959, Ser. No. 861,276. Divided and this application Jan. 18, 1961, Ser. No. 89,599
9 Claims. (Cl. 29—25.3)

This invention relates to a method of making semiconductor assemblies and more particularly to miniaturized assemblies designed for integration into miniaturized circuit systems.

Miniaturized semiconductor assemblies designed for automatic manufacturing and assembling into circuit systems present a number of special problems and should desirably have certain characteristics. Such assemblies should embody means for externally determining orientation of the devices in the assembly. They should also embody construction materials which may be handled in miniaturized assemblies. Additionally they should be designed for simplified assembly techniques.

Semiconductor assemblies have heretofore been packaged with wire leads extending from one or both ends, and often from a semiconductor device crystal whose greatest dimension is about the diameter of such wire leads. Device packages or assemblies are thus designed as much to support the wire leads as to support and contain a semiconductor crystal.

An object and advantage of the present invention is to provide a semiconductor assembly having electrodes forming opposite and parallel faces of a cylindrical assembly to which external connections may be made. By making such electrodes relatively thin and parallel to the major surfaces of the semiconductor crystal, the crystal package may be of about the diameter of the semiconductor crystal, and shorter axially than across the diameter. This facilitates automatic handling of such assemblies, and makes possible electrical interconnection systems having small bulk, such as circuit board assemblies, which are not feasable when conventional lead wires are provided. The assembly herein disclosed is particularly adapted for use in interconnection systems utilizing films or thin sheets of conductive material instead of conventional wire leads and interconnecting wires. Sheets and films of a thickness of the order of that of the exposed electrodes of the semiconductor assembly are particularly adaptable to making electrically conducting connections thereto with a resulting minimum of volume and weight.

This application is a division of application Serial Number 861,276 filed December 22, 1959.

The above and other objects and advantages of this invention will be explained by or be made apparent from the following disclosure and the preferred embodiment of the invention as illustrated therein and in the drawing, in which.

Figure 1:
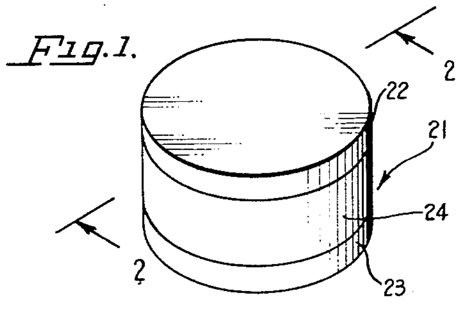
FIG. 1 is a perspective view of a diode according to the present invention.
Figure 2:
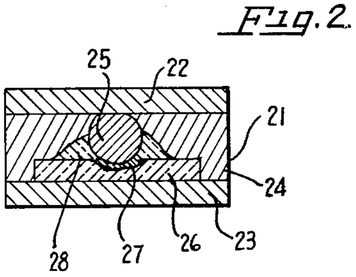
FIG. 2 is a sectional view of the diode of FIG. 1 taken on line 2—2 thereof.

The diode of FIGS. 1 and 2 is preferably made in cylindrical shape as shown and with a diameter of .050" and a height, or thickness, of .030".

According to the present invention as illustrated by the diode in the drawing, at least one PN junction is formed on a semiconductor crystal; a small quantity of moisture resistant, high purity insulating material, which is plastic in, or slightly above, the normal operating temperature range of the device, is applied to the exposed edges of the PN junction; and the device is encapsulated between upper and lower electrodes in an insulating material which is elastic in the operating temperature range of the device, and has a softening temperature, if any, above that of the plastic insulating material.

In FIG. 1 there is shown a diode 21 having upper and lower electrodes 22 and 23, respectively, and insulating material 24 therebetween. To provide for proper indexing of the diode 21 the lower electrode 23 is preferably made of a non-magnetic material such as gold clad molybdenum, and the upper electrode 22 is preferably made from a magnetic material such as gold clad iron, nickel iron, or other ferromagnetic materials.

Figure 5:
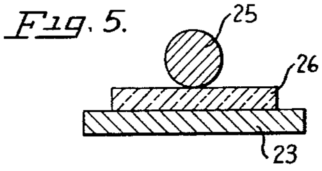
FIGS. 5 through 10 show steps in the process of manufacturing of the diode of FIGS. 1 and 2.
Figure 6:
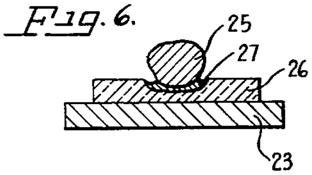

The diode 21 illustrated in FIG. 1 is manufactured by placing a bit 25 of aluminum upon an N-type silicon semiconductor crystal 26 which has preferably been bonded to an electrode 23 as shown in FIG. 5. This assembly is heated to a suitable temperature, preferably about 700° C., to fuse the bit 25 to the surface of the silicon crystal 26. Upon cooling, a regrown region 27 of P-type silicon crystal is formed, as shown in FIG. 6, as a small quantity of aluminum from the bit 25 enters the crystal. A PN junction is thus formed between the regrown region 27 and the main body of the crystal 26. The fused assembly, and in particular the exposed surface of the PN junction, is cleaned in the usual manner, such as by an etchant of equal parts of acetic acid, nitric acid and water. This cleaning, or etching, process produces an under-cut region below the bit 25.

Figure 7:
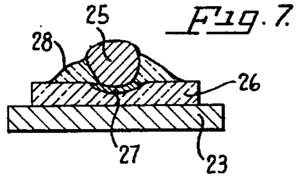

A small quantity of insulating material which is plastic in or slightly above the normal operating temperature range of the desired diode is then placed on the crystal 26 at the surface of the PN junction formed thereon. For this material it is preferred to use a high purity, low melting temperature glass 28 as shown in FIG. 7, such as 24% arsenic, 67% sulphur and 9% iodine nominal composition, with impurities of sodium, manganese, silicon, copper and iron of the order of 25 parts per million by spectrographic analysis. A wide variety of suitable low melting glasses is commercially available, and these are generally characterized by high fluidity at relatively low temperature, such as below 400° C., which makes them ideally suitable for coating exposed edges of PN junctions. Such glasses also include arsenic, sulfur and selenium; arsenic, sulfur and thallium; and other arsenic, sulfur and iodine glasses. The glass purity must be of the order of that of the semiconductor crystal to avoid surface contamination of the PN junction. The low melting glass 28 may be flowed onto the PN junction surface of the crystal at 300° C., to form the structure of FIG. 7. It is preferred to utilize gold clad molybdenum for the electrode 23 to provide a nonmagnetic electrode which is easily bonded to the silicon crystal.

Figure 8:
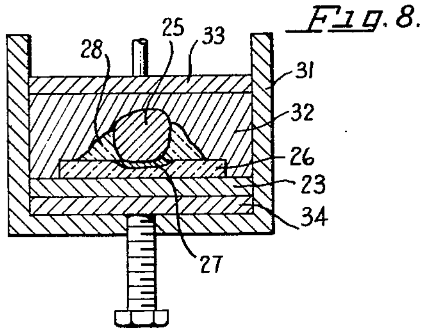
Figure 9:
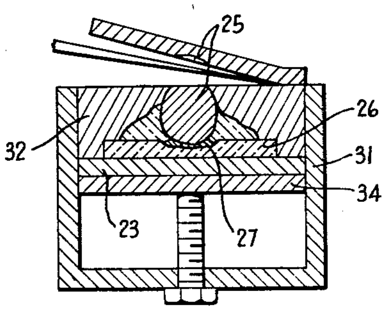

The assembled lower electrode 23 and the P–N junction device bonded thereto is then placed in a recess within a press 31, as shown in FIG. 8, and a quantity of insulating material 32 is then added to the recess to cover the device. For this insulating material it is preferred to use one of the high purity fluorocarbons, or polyfluorocarbons which may be formed under high pressure and becomes substantially elastic at the ordinary operating temperatures of the semiconductor device. Such fluorocarbons are commercially available under trade names of Kel-F, Genetron, and Teflon. After the fluorocarbon 32 has been pressed into the recesses of the press 31 by a ram 33, a movable base 34 at the bottom of the recess is raised to a predetermined height as shown in FIG. 9 to force a portion of the fluorocarbon material 32 above the recess. This portion is then removed by shaving, grinding, or other suitable means. The bit 25 has been selected and processed in such a fashion as to extend beyond the level at which the material 32 is thus shaved. This provides a point of attachment for any electrode through the bit 25 to the regrown region 27 of the crystal.

Figure 10:
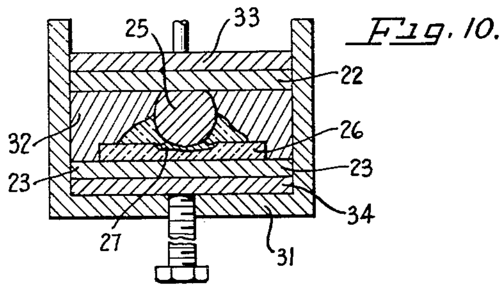

As shown in FIG. 10, the movable base 34 is lowered to the bottom of the recess in the press 31, and upper electrode 22, which is preferably made of a magnetic material, is inserted into the recess and mechanically and electrically connected to the upper surface of the insulating material 32 and the bit 25. This may be done by interposing between the surfaces to be connected an epoxy bonding material containing electrically conductive metallic flakes such as gold, and applying pressure to the upper surface of the electrode 22 by the ram 33. While it is necessary for the upper electrode 22 to be electrically connected to the bit 25, it is also desirable for the insulating material 32 to be bonded to the upper electrode primarily for stability in mechanical handling and to provide protection to the crystal from impurities and ambient atmosphere.

Obtaining a mechanical attachment of the upper electrode to the fluorocarbon material has heretofore presented considerable difficulty. Special surface treatments have been applied to fluorocarbons, including polyfluorocarbons, to prepare them for bonding. This introduces extra process steps and increases possibilities of adding unwanted impurities to the semiconductor. An alternate method for bonding the upper electrode 22 to the bit 25 and the fluorocarbon insulating material is to first coat the electrode 22 with gold, and then with tin, as by vapor deposition or plating techniques. Subsequently the upper surface of the shaved insulating material and aluminum-silicon eutectic material 25 is contacted by the electrode and heated to above the gold-tin eutectic temperature. The gold-tin bonds to the bit 25 and also to the fluorocarbon, forming a stable physical bond to the fluorocarbon as well as to the bit 25.

The final diode structure produced has heretofore been explained and is shown in FIG. 2 in section, with the low melting glass 28 protecting the PN junction surface and with the insulating material 32 surrounding the low melting glass. To provide suitable moisture resistance in the encapsulation, the high purity low melting glass has been chosen to protect the PN junction. Many such low melting glasses are presently available, as before noted, and have in common the properties of good adherence to silicon, and other semiconductor crystals, resistance to penetration of moisture, very low softening and flow temperatures, and a property of absorbing impurities from a semiconductor crystal surface. To protect and contain the low melting glass 28, an insulating material is chosen which becomes substantially elastic at normal operating device temperatures. The fluorocarbon series of insulating materials is especially suitable for this purpose.

Figure 3:
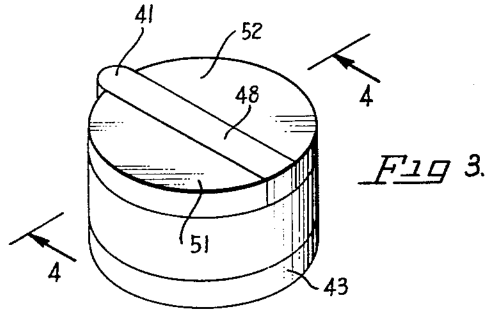
FIG. 3 is a perspective view of a transistor according to the present invention.
Figure 4:
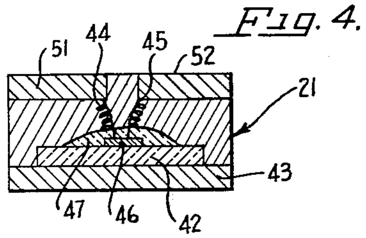
FIG. 4 is a sectional view of the transistor of FIG. 3 taken on line 4—4 thereof.

A transistor as shown in FIGS. 3 and 4 may also be produced according to this invention and in about the same size as the diode excepting that it is preferred to produce indexing tab 41 in the transistor encapsulation. As better shown in FIG. 4, a silicon semiconductor crystal 42 is bonded to a lower electrode 43, preferably nonmagnetic material, and a mesa type junction transistor structure is formed on the crystal. Leads 44 and 45 are attached to the mesa 46 and a low melting glass 47 is applied around the junction areas in the manner hereinbefore described for the diode 21. Insulating material 48 is then added, as with the diode, except that the leads 44 and 45 extend upwardly through the insulating material. It is preferred to coil or angle the leads 44 and 45 for reasons hereinafter appearing. A pair of magnetic upper electrodes 51 and 52 are then bonded to the material 48 after shaving the surface thereof in the manner as taught for the diode 21. In the process of shaving the insulating material 48, the coiled or angled leads will expose a greater surface for attachment to the respective electrodes than if the electrodes extended vertically through the insulating material. The electrode 51 and 52 form less than semicircular segments for a substantially circular transistor assembly, so that they are separated by a volume of the insulating material 48. Independent electrical connections may therefore be made through the respective electrodes 51 and 52, and leads 44 and 45, to the mesa structure 46. The other electrical connection to the crystal 42 is made through electrode 43.

The foregoing assemblies produced as hereinbefore described are adaptable to accommodation in miniature circuit board assemblies. By virtue of the dual potting compound system by which the junctions are first protected by a low melting glass, which in turn is contained in a fluorocarbon insulating plastic, semiconductor devices made as herein taught are extremely rugged and reliable.

What is claimed is:

1. The method of making a semiconductor device package, which comprises: fusing a bit of electrical conductivity type determining impurity material to a face of a semiconductor crystal; covering at least a portion of said face and bit with insulating material; removing a portion of said bit and insulating material to expose a substantially planar surface of said insulating material surrounding an area of said bit; and bonding an electrode to said surface in ohmic contact with said area of said bit.

2. The method according to claim 1 wherein said electrode is bonded to said planar surface by an insulative bonding cement containing particles of electrically conductive material to provide an electrically conducting path between said bit and said electrode.

3. The method according to claim 1 wherein said electrode is coated on at least one surface with gold and tin; and said surface is placed in contact with said substantially planar surface and heated above the eutectic temperature of gold and tin to bond said electrode to said substantially planar surface.

4. The method of bonding fluorocarbon material to a metal surface, which comprises: coating the metal surface with alternate layers of gold and tin; contacting the coated metal surface with the fluorocarbon material; and heating the contacted materials above the gold-tin eutectic temperature.

5. The method of making a semiconductor device, which comprises: bonding a first face of a semiconductor crystal to a first electrode; bonding an electrical connection to a second face of said crystal; covering said crystal and at least a portion of said connection with an insulating material; removing a portion of said insulating material to expose a surface thereof surrounding an area of said connection; and bonding a second electrode to said surface and in ohmic contact with said connection.

6. The method of making a semiconductor device, which comprises: bonding a first face of a semiconductor crystal to a face of a first planar electrode; bonding a plurality of electrical connections to other faces of said crystal; covering the portions of said crystal not so bonded and at least a portion of each of said connections with insulating material; removing a portion of said insulating material to expose a surface thereof surrounding an area of each of said connections; and bonding a plurality of planar electrodes to said surface, spaced from each other, and each in ohmic contact with one of said connections.

7. In a method of making a semiconductor device having a semiconductor body, a first planar electrode bonded to said body in a position parallel to one surface of the body, an electrical connection from another portion of the body, a second planar electrode bonded to said electrical connection, an insulating material surrounding said electrical connection and said body and separating said first and second electrodes, the improvement which comprises: prior to bonding the second electrode, removing a portion of the electrical connection to expose a surface thereof of coplanar with the insulating material; and bonding the second planar electrode to the electrical connection and to the insulating material.

8. A method according to claim 7 wherein the electrical connection is first covered with the insulating material, and portions of the insulating material and of the electrical connection are removed to expose a planar surface of the insulated material surrounding a coplanar surface of the electrical connection, and thereafter bonding the second planar electrode to the exposed surfaces of insulating material and the electrical connection.

9. In the art of making semiconductor devices, the improvement which comprises: forming a planar surface of insulating material and an electrical connection portion of a semiconductor body with the portion of said surface formed by the portion of the body surrounded by the portion of the surface formed by the insulating material; and bonding an electrode to both the insulating material portion and the electrical connection portion of the planar surface.

References Cited in the file of this patent

UNITED STATES PATENTS

| | | |
|---|---|---|
| 2,802,897 | Hurd | Aug. 13, 1957 |
| 2,888,736 | Sardella | June 2, 1959 |
| 2,923,640 | Buckingham | Feb. 2, 1960 |
| 3,002,135 | Warren | Sept. 26, 1961 |
| 3,065,534 | Marino | Nov. 27, 1962 |
| 3,066,248 | Miller | Nov. 27, 1962 |
| 3,080,640 | Jochems | Mar. 12, 1963 |

FOREIGN PATENTS

| | | |
|---|---|---|
| 554,048 | Belgium | Jan. 31, 1957 |
| 835,583 | Great Britain | May 25, 1960 |